United States Patent
Zommer

Patent Number: 6,107,674
Date of Patent: Aug. 22, 2000

[54] ISOLATED MULTI-CHIP DEVICES

[75] Inventor: Nathan Zommer, Los Altos, Calif.

[73] Assignee: IXYS Corporation, Santa Clara, Calif.

[21] Appl. No.: 08/057,291

[22] Filed: May 5, 1993

[51] Int. Cl.[7] .......... H01L 23/58; H01L 23/522; H01L 23/485; B32B 15/08

[52] U.S. Cl. .......... 257/642; 257/686; 438/758; 428/458

[58] Field of Search .......... 428/458, 334; 437/180; 156/643, 644; 257/707, 686, 642, 643, 723; 438/107, 758, 584, 652, 778, 780

[56] References Cited

U.S. PATENT DOCUMENTS

| | | | |
|---|---|---|---|
| 4,089,766 | 5/1978 | Paal et al. | 204/192 |
| 4,341,594 | 7/1982 | Carlson et al. | 156/643 |
| 4,356,056 | 10/1982 | Cornette | 156/649 |
| 4,423,547 | 1/1984 | Farrar et al. | 29/571 |
| 4,583,283 | 4/1986 | Dubois | 29/589 |
| 4,618,878 | 10/1986 | Aoyama | 357/71 |
| 4,662,064 | 5/1987 | Hsu et al. | 29/591 |
| 4,695,867 | 9/1987 | Flohrs et al. | 357/46 |
| 4,758,476 | 7/1988 | Sekine et al. | 428/473.5 |
| 4,824,716 | 4/1989 | Yerman | 428/209 |
| 4,959,705 | 9/1990 | Lemnios | 357/51 |
| 4,996,584 | 2/1991 | Young et al. | 357/71 |
| 5,012,322 | 4/1991 | Guillotte et al. | 357/72 |
| 5,031,021 | 7/1991 | Baba et al. | 357/53 |
| 5,162,258 | 11/1992 | Lemnios et al. | 437/184 |
| 5,266,746 | 11/1993 | Nishihara et al. | 174/254 |
| 5,275,973 | 1/1994 | Gelatos | 437/195 |
| 5,278,724 | 1/1994 | Angular et al. | 361/707 |
| 5,288,541 | 2/1994 | Blackwell et al. | 428/209 |
| 5,339,217 | 8/1994 | Cohen et al. | 361/707 |
| 5,384,691 | 1/1995 | Neugebauer et al. | 361/794 |
| 5,536,584 | 7/1996 | Sotokawa et al. | 428/458 |

Primary Examiner—Deborah Jones
Assistant Examiner—Michael LaVilla
Attorney, Agent, or Firm—Townsend and Townsend and Crew LLP

[57] ABSTRACT

A semiconductor device structure in which a power semiconductor device is used as the substrate for the structure. Initially, a first metallization layer is formed on the power semiconductor device. Then, a dielectric passivation layer is formed over the first metallization layer, the dielectric passivation layer having apertures through which the first metallization layer may be accessed. A polymer passivation layer is then formed on the dielectric passivation layer, the polymer passivation layer also having apertures through which the first metallization layer and the dielectric passivation layer may be accessed. A second metallization layer is then formed on the polymer passivation layer to which at least one electronic component is connected. In specific embodiments, the polymer passivation layer includes polyimide.

24 Claims, 2 Drawing Sheets

ISOLATED MULTI-CHIP DEVICES

BACKGROUND OF THE INVENTION

This invention relates to a semiconductor device structure and method wherein a power semiconductor device is employed as a substrate upon which other electronic components are disposed.

In the past, multi-chip power circuits have been designed in which a power semiconductor device was employed as a substrate upon which low voltage control circuitry was mounted. Previous techniques for galvanically isolating the power device from its associated control circuitry have achieved galvanic isolation on the order of 500 volts. The use of passivation materials having greater isolating characteristics has been problematic in that other characteristics of these materials have limited the manner in which the forward voltage drop of the power device may be reduced. For example, the low temperature tolerance of some passivation materials have made it impossible to perform high temperature processing (e.g., furnace anneal) of the power device to ensure a low voltage drop through the device.

Therefore, because of the relatively low galvanic isolation achieved by previous multi-chip techniques, there is a need for a multi-chip structure and method which achieve greater isolation between a power semiconductor device substrate and its associated low voltage control circuitry.

SUMMARY OF THE INVENTION

The invention provides a semiconductor device structure and a method for producing the structure in which a power semiconductor device is used as the substrate for the structure. The invention provides greater galvanic isolation between the components of the structure than previously possible.

The structure comprises the following elements: a first metallization layer formed on a power semiconductor device; a first passivation layer formed above the first metallization layer; a polymer passivation layer formed above the first passivation layer; and a second metallization layer formed above the polymer passivation layer. At least one electronic component is connected to the second metallization layer.

In specific embodiments the first passivation layer comprises a dielectric material, such as an oxide, a nitride, glass, or ceramic, the first passivation layer having apertures through which the first metallization layer may be accessed. The first metallization layer is the layer in which die attach pads and conductors for the underlying semiconductor device may be formed. Also, in specific embodiments, the polymer passivation layer comprises polyimide, and has apertures through which the first metallization layer and the first passivation layer may be accessed. The apertures in the passivation layers may be formed using standard photomasking techniques. In fact, one of the advantages of the invention is that it can be produced using standard fabrication techniques. Specific embodiments also include structures in which the electronic components connected to the second metallization layer comprise at least one integrated circuit die. The structure and method of the present invention are able to produce a power electronic circuit with full galvanic isolation between components of up to 2,400 volts.

A further understanding of the nature and advantages of the present invention may be realized by reference to the remaining portions of the specification and the drawings.

DESCRIPTION OF THE SPECIFIC EMBODIMENTS

Figure 1:
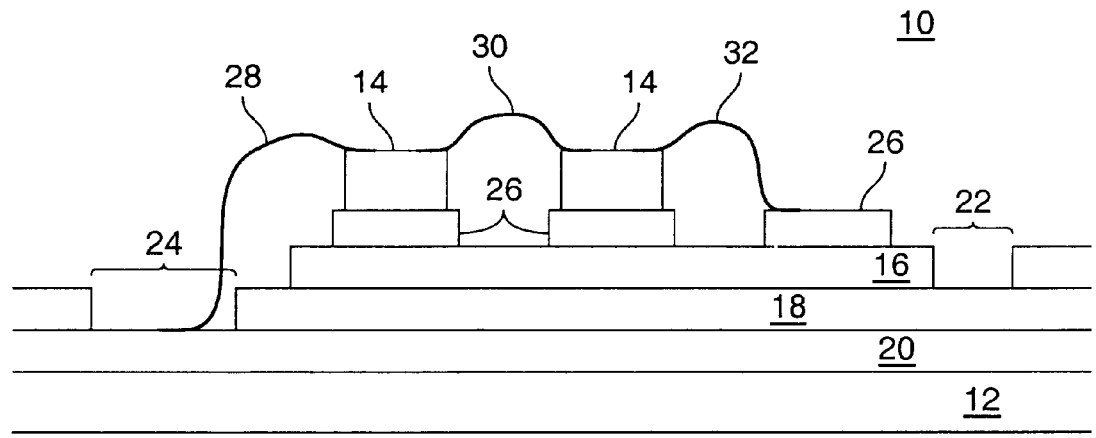
FIG. 1 is a cross-sectional view of a multi-chip structure according to the present invention.

FIG. 1 is a cross-sectional view of a multi-chip structure 10 fabricated according to the present invention. In this embodiment of the invention, a power semiconductor device 12 is employed as a substrate for multi-chip structure 10. Power device 12 may be fabricated according to a new method for fabricating low-drop power devices using polymer passivation materials, described in a commonly assigned, co-pending U.S. patent application Ser. No. 08/057,293, entitled ADVANCED POWER DEVICE PROCESS FOR LOW DROP. Power device 12 is controlled by low voltage electronic components 14, which include integrated circuit dice and other electrical components. These components are mounted to the top surface of a multi-layer structure formed on power device 12. This multi-layer structure includes, starting from the bottom, a first metallization layer 20, a dielectric passivation layer 18, a polymer passivation layer 16, and a second metallization layer 26. Polymer passivation layer 16 is formed during the power device processing using any number of well known methods, and provides a high galvanic isolation between components 14 and power device 12. Polymer passivation layer 16 is relatively thick in comparison with typical semiconductor fabrication dimensions (i.e., greater than 1 micron ($10^{-6}$ meter)).

Dielectric passivation layer 18 is composed of glass (i.e., silicon based glass, $SiO_2$), silicon nitride (i.e., $Si_3N_4$), or any combination thereof, and is disposed on top of metallization layer 20. Polymer passivation layer 16 is formed on top of dielectric 18. The polymer and dielectric layers are patterned to form apertures 22 and 24 through which both dielectric layer 18 and power device metallization layer 20 may be accessed respectively. Polymer layer 16 may be treated essentially as a printed circuit board, with another metallization layer 26 deposited on top of it. Any compatible metal for semiconductor processing may be used. Patterns of bonding pads, die attach areas, and conductor lines may be formed in metallization layer 26. Components 14, including integrated circuit dice and other electronic components, may then be attached to metallization layer 26 and wire-bonded according to the desired circuit pattern. Wire bonding may be achieved between the low voltage dice 14 and power device 12 (wires 28), between two or more of the low voltage dice themselves (wires 30), and between the low voltage dice and pads of metallization layer 26 (wires 32).

The high voltage isolation between the circuit dice is determined by the thickness of polymer 16 and other spatial layout design parameters. The key to obtaining high isolation with such a composite integrated device is the use of a polymer material which is compatible with integrated circuit and semiconductor processing, the material having the following characteristics:

a) can withstand temperatures up to 450° C.;

b) can be patterned using standard photoresist developing;

c) is clean to MOS level, low sodium and other impurities;

d) can withstand high voltage and is compatible with the high surface fields of the power device;

e) forms a solid, hard film after polymerization; and f) exhibits good adhesion characteristics with respect to glass, ceramic, and metal, both above and below the material.

A typical choice of polymer passivation material is polyimide. The recommended thickness is from approximately 3 microns up to 10 microns, depending upon the desired isolation. With the use of sufficiently thick polymer (i.e., 5 micron polyimide) die attach pads can be placed on the polymer surface directly above the active area of the power device.

Figure 2:
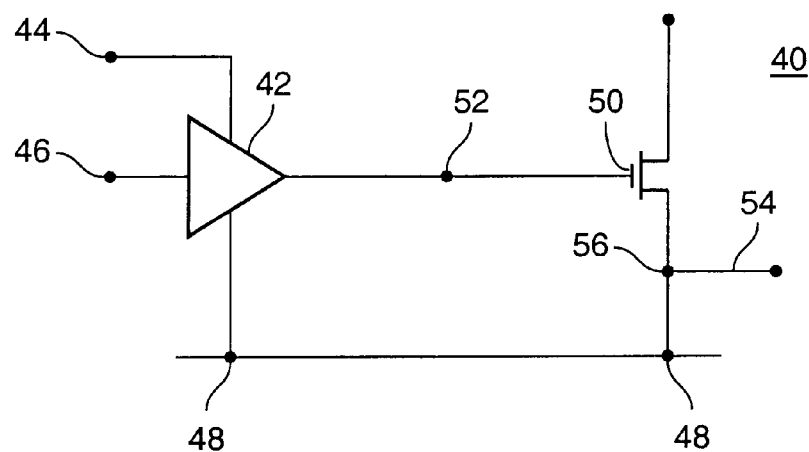
FIG. 2 is a schematic representation of a power device and its associated integrated circuit driver.
Figure 3:
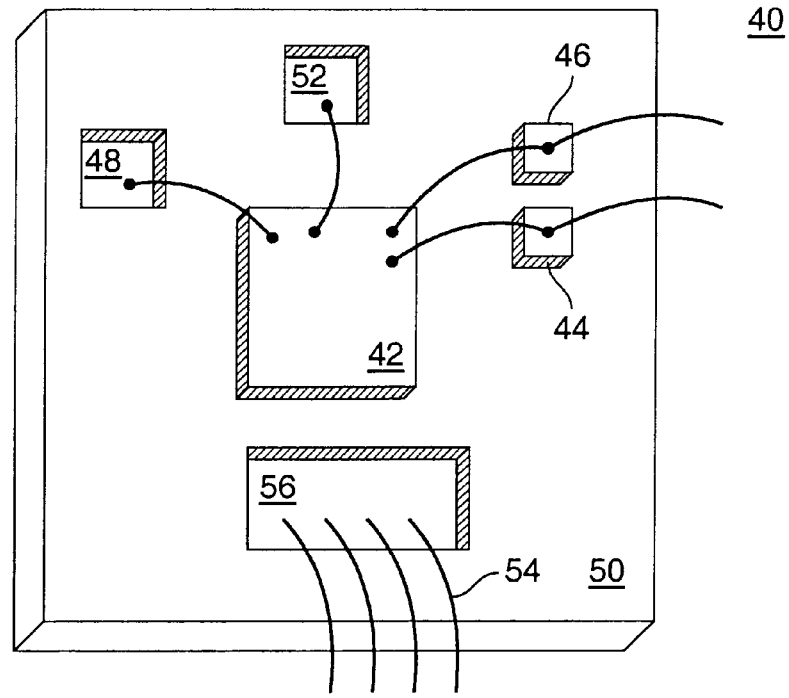
FIG. 3 is a top view of the multi-chip structure according to the present invention represented schematically in FIG. 2.

FIG. 2 schematically shows a typical circuit 40 to be implemented according to the invention. FIG. 3 shows a structural top view of the same circuit. Circuit 40 is a driver integrated circuit 42 on top of and controlling a power device 50. Driver IC 42 is connected to metal bonding pads 44 and 46, providing power and input signals respectively. Driver IC 42 is also connected to ground 48 of power device 50. The output terminal of driver IC 42 is connected to gate 52 of power device 50. Source power wires 54 are connected to source 56 of power device 50.

Figure 4:
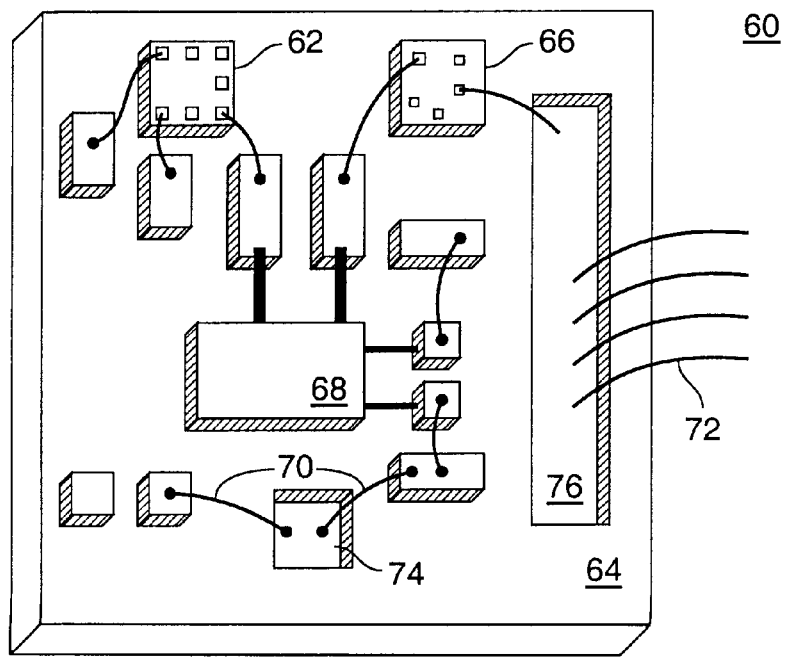
FIG. 4 is a top view of an additional embodiment of a multi-chip structure according to the present invention.

FIG. 4 shows another implementation of the present invention, namely multiple integrated circuit dice and conductors with drive isolation mounted on a multi-chip structure 60. Multi-chip structure 60 utilizes a driver IC 62 to control a power device 64, while a driver sensor IC 66 provides feedback from the power device's source region 76. A transformer or optocoupler 68 provides the drive isolation. Gate and source wires 70 and 72 access the surface of the power device active regions, namely gate 74 and source 76.

a) Depositing a first metallization layer on a power device wafer.

b) Depositing an oxide, nitride, glass, or ceramic passivation on the first metallization layer and the power device wafer.

c) Depositing a polymer passivation.

d) Depositing a photoresist.

e) Photomasking to define windows in the polymer and dielectric passivation layers.

f) Etching photomask pattern.

q) Curing polymer passivation.

h) Depositing a top metallization layer.

i) Photomasking to define die pads, wire bonding and conductor pads.

j) Further processing not in excess of 400° C. (approximate). After processing and probing finished wafers are ready for sawing or other dicing techniques. Individual dice are then selected for assembly.

k) Die attaching "power dices" in a suitable package.

l) Attaching ICs and other components that need to be attached on top of the power device.

m) Wire bonding all the components according to the desired circuit pattern.

n) Sealing, potting, or otherwise encapsulating the structure.

In conclusion, it can be seen that the present invention allows the construction of multi-chip devices possessing excellent electrical isolation properties. While the invention has been particularly shown and described with reference to a specific embodiment thereof, it will be understood by those skilled in the art that the foregoing and other changes in the form and details may be made therein without departing from the spirit or scope of the invention.

What is claimed is:

1. A semiconductor device structure, comprising:

a power semiconductor device having a top surface, the power semiconductor device being a substrate for the structure;

a first metallization layer deposited over the top surface of the power semiconductor device;

a first passivation layer deposited over the first metallization layer;

a second passivation layer deposited over the first passivation layer, the second passivation layer comprising a polymer and having a thickness greater than one micron;

a second metallization layer deposited over the second passivation layer; and at least one electronic component disposed above and connected to the second metallization layer; and wherein the polymer has a characteristic capability of withstanding high voltages, the second passivation layer thus providing a selected degree of galvanic isolation between the top surface of the power semiconductor device and the electronic component according to the polymer's capability of withstanding high voltages and the thickness of the second passivation layer.

2. The semiconductor device structure of claim 1 wherein the second passivation layer comprises polyimide.

3. The semiconductor device structure of claim 1 wherein the first passivation layer comprises a dielectric.

4. The semiconductor device structure of claim 1 wherein the first passivation layer has a plurality of first apertures therethrough which expose the first metallization layer, and the second passivation layer has a plurality of second apertures therethrough which expose the first metallization layer and the first passivation layer.

5. The semiconductor device structure of claim 3 wherein the dielectric comprises an oxide.

6. The semiconductor device structure of claim 3 wherein the dielectric comprises a nitride.

7. The semiconductor device structure of claim 1 wherein the first passivation layer comprises $SiO_2$.

8. The semiconductor device structure of claim 1 wherein the first passivation layer comprises $Si_3N_4$.

9. The semiconductor device structure of claim 4 wherein the first and second apertures are formed by etching a photoresist pattern.

10. The semiconductor device structure of claim 1 further comprising at least one integrated circuit connected to the second metallization layer, the at least one integrated circuit being separate from the power semiconductor device.

11. A semiconductor device structure, comprising:

a power semiconductor device having a top surface, the power semiconductor device being a substrate for the structure;

a first metallization layer deposited over the top surface of the power semiconductor device;

a dielectric passivation layer deposited over the first metallization layer, the dielectric passivation layer having a plurality of first apertures therethrough which expose the first metallization layer;

a polymer passivation layer deposited over the dielectric passivation layer, the polymer passivation layer having a plurality of second apertures therethrough which expose the first metallization layer and the dielectric passivation layer, the polymer passivation layer having a thickness greater than one micron;

a second metallization layer deposited over the polymer passivation layer, the second metallization layer comprising pads and conductors; and at least one integrated circuit disposed above the second metallization layer and connected to the pads formed in the second metallization layer, the at least one integrated circuit being separate from the power semiconductor device; and wherein the polymer passivation layer comprises a polymer having a characteristic capability of withstanding high voltages, the polymer passivation layer thus providing a selected degree of galvanic isolation between the top surface of the power semiconductor device and the at least one integrated circuit according to the polymer's capability of withstanding high voltages and the thickness of the polymer passivation layer.

12. The semiconductor device structure of claim 11 wherein the polymer passivation layer comprises polyimide.

13. The semiconductor device structure of claim 11 wherein the dielectric passivation layer comprises an oxide.

14. The semiconductor device structure of claim 11 wherein the dielectric passivation layer comprises a nitride.

15. The semiconductor device structure of claim 11 wherein the dielectric passivation layer comprises $SiO_2$.

16. The semiconductor device structure of claim 11 wherein the dielectric passivation layer comprises $Si_3N_4$.

17. The semiconductor device structure of claim 11 wherein the first and second apertures are formed by etching a photoresist pattern.

18. A hybrid integrated circuit device comprising:

a power semiconductor device having a top surface;

a dielectric passivation layer disposed on the top surface;

a galvanic isolation layer disposed on the dielectric passivation layer, the galvanic isolation layer comprising polyimide and having a thickness of at least one micron; and an electronic component disposed over an upper surface of the galvanic isolation layer.

19. The device of claim 18 wherein the electronic component is electrically coupled to at least one terminal of the power semiconductor device and is capable of controlling the power semiconductor device.

20. A semiconductor device structure comprising:

a power semiconductor device having a top surface, the power semiconductor device being a substrate for the structure;

a dielectric passivation layer deposited over the top surface;

a galvanic isolation layer deposited over the dielectric passivation layer, the galvanic isolation layer comprising polyimide and having a thickness greater than about one micron;

a metallization layer deposited over the galvanic isolation layer; and at least one low-voltage electronic device die disposed over the metallization layer.

21. The device structure of claim 20 wherein the electronic device die is capable of controlling the power semiconductor device.

22. The device of claim 20 further comprising a second metallization layer deposited over the top surface of the power semiconductor device and under the dielectric passivation layer wherein the galvanic isolation layer has a plurality of first apertures therethrough which expose the second metallization layer through a plurality of second apertures in the dielectric passivation layer, and wherein the electronic device die is electrically coupled to the second metallization layer through the first and second apertures.

23. The device of claim 22 wherein the electronic device die is electrically coupled to the second metallization layer with a wire bond.

24. A semiconductor device structure comprising:

a power semiconductor device having a top surface, the power semiconductor device being a substrate for the structure;

a first metallization layer deposited over the top surface of the power semiconductor device;

a dielectric passivation layer comprising silicon nitride or silicon oxide deposited over the first metallization layer;

a polyimide galvanic isolation layer having a thickness greater than about one micron deposited over the dielectric passivation layer;

a second metallization layer deposited over the polyimide galvanic isolation layer; and an electronic device die disposed over the second metallization layer, the electronic device die being capable of controlling the power semiconductor device.

* * * * *